(12) United States Patent
Chen et al.

(10) Patent No.: US 12,653,053 B2
(45) Date of Patent: Jun. 9, 2026

(54) PACKAGING STRUCTURE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Xiaowei Xu, Guangdong (CN); Gao Huang, Guangdong (CN); Benxia Huang, Guangdong (CN); Wenjian Lin, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 728 days.

(21) Appl. No.: 17/955,759

(22) Filed: Sep. 29, 2022

(65) Prior Publication Data

US 2023/0282565 A1     Sep. 7, 2023

(30) Foreign Application Priority Data

Mar. 4, 2022     (CN) ......................... 202210232068.7

(51) Int. Cl.
| | |
|---|---|
| *H10W 70/67* | (2026.01) |
| *H10W 70/05* | (2026.01) |
| *H10W 70/65* | (2026.01) |
| *H10W 70/685* | (2026.01) |
| *H10W 90/00* | (2026.01) |

(52) U.S. Cl.
CPC ......... *H10W 70/688* (2026.01); *H10W 70/05* (2026.01); *H10W 70/093* (2026.01); *H10W 70/095* (2026.01); *H10W 70/65* (2026.01); *H10W 70/685* (2026.01); *H10W 90/00* (2026.01); *H10W 90/401* (2026.01); *H10W 90/724* (2026.01); *H10W 90/754* (2026.01)

(58) Field of Classification Search
None
See application file for complete search history.

(56) References Cited

U.S. PATENT DOCUMENTS

| | | | | |
|---|---|---|---|---|
| 5,093,761 A | * | 3/1992 | Ozaki | ................... H05K 3/4691 |
| | | | | 174/266 |
| 2004/0164396 A1 | * | 8/2004 | Hashimoto | ......... H01L 23/5387 |
| | | | | 257/E23.177 |
| 2004/0264148 A1 | * | 12/2004 | Burdick, Jr. | ........... H05K 1/189 |
| | | | | 361/748 |
| 2008/0149372 A1 | * | 6/2008 | Choi | ...................... H05K 1/147 |
| | | | | 174/254 |
| 2009/0038836 A1 | * | 2/2009 | Takahashi | ............ H05K 3/4691 |
| | | | | 29/830 |

* cited by examiner

*Primary Examiner* — Cory W Eskridge
(74) *Attorney, Agent, or Firm* — The PL Law Group, PLLC

(57)     ABSTRACT

A packaging structure includes multiple packaging units, and the packaging units include a hard plate region, a winding region, and a fan-out region. In the packaging structure, the hard plate region of the packaging unit is arranged in a stacked manner, some or all of the fan-out regions are packaged with a chip, and some or all of the fan-out regions packaged with a chip are stacked with the hard plate regions after being bent by the winding region. So designed, each fan-out region is individually packaged and then packaged by stacking with each other to achieve the interconnections between a chip and a chip, and between a chip and a substrate without interference between the packaging units.

9 Claims, 8 Drawing Sheets

10

11

12

FIG. 1K
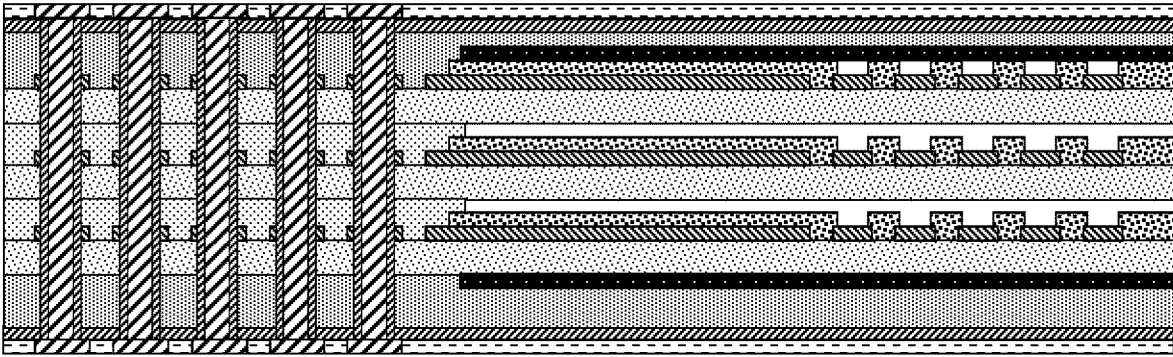
13
FIG. 1L
14
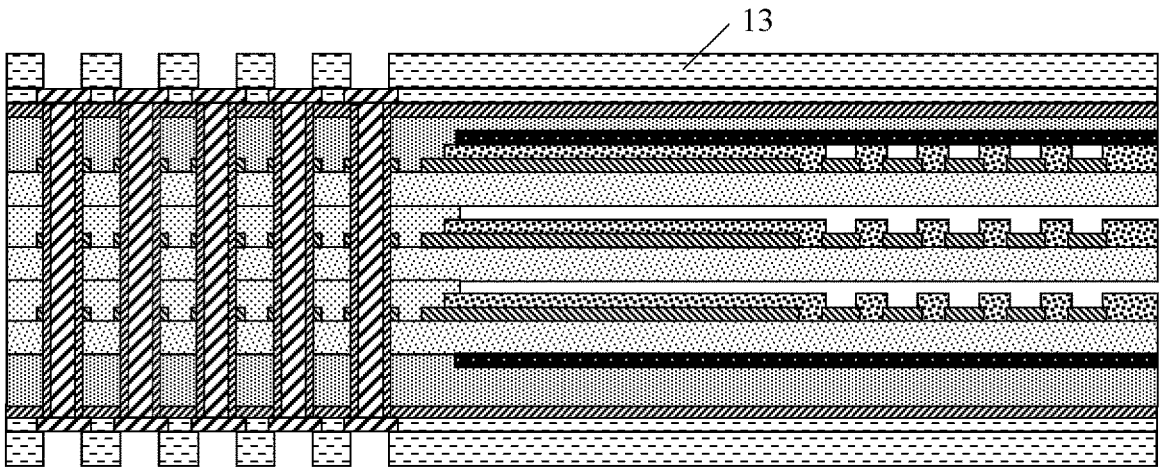
FIG. 1M

PACKAGING STRUCTURE AND MANUFACTURING METHOD THEREOF

CROSS REFERENCE TO RELATED APPLICATIONS AND CLAIM OF PRIORITY

The present application claims the benefit of Chinese Patent Application No. 202210232068.7 filed on Mar. 4, 2022 at the Chinese Intellectual Property Office, the disclosures of which are incorporated by reference herein in their entirety.

BACKGROUND

1. Technical Field

Embodiments of the present application relate to the technical field of semiconductor packaging, and more particularly, to a packaging structure and a manufacturing method thereof.

2. Background of the Invention

As the miniaturization of electronic products is the current trend, the trend for the semiconductor industry is to integrate functions widely and increase the packing density. In the field of semiconductor package tests, a conventional packaging method is to arrange multiple chips or components and parts in the XY direction of a substrate to improve the integration of packaging functions. This method has its own defects, namely, increasing the packaging area in the XY direction, which is not conducive to the miniaturization of products. Therefore, using a more advanced packaging method to reduce the packaging area is the direction of the current packaging technology development.

In existing packaging technologies, MCP (Multiple Chip Package) and PoP (Package on Package) multi-stack packaging technologies can achieve stacking in the Z direction, thereby reducing the packaging area in the X direction and Y direction.

The MCP packaging technology stacks multiple chips in the Z direction in a plastic package housing to achieve package integration and simultaneously achieve XY-direction miniaturization. The MCP packaging chip stacking modes are divided into pyramid stacking and suspended stacking. The pyramid stacking defines the size and stacking sequence of the stacked chips, and the suspended stacking also limits the size of the chips. At the same time, since the chip is suspended, it is easy to cause chip crack due to stress problems, especially for a thin chip, and the risk of products needing to be wired at a suspended position is higher.

For the PoP package, since an interconnection needs to be realized between two packages, which is usually a BGA (Ball Grid Array) interconnection, the interconnection position has both the functions of electrical conduction and physical indirection. There is often stress between packages due to factors such as a difference between CTEs (coefficient of thermal expansion), and the stress causes package warpage. Therefore, the interconnection between packages and the interconnection between a lower-layer package and a mother substrate fail.

SUMMARY

In view of the above, it is an object of embodiments of the present application to provide a packaging structure and a manufacturing method.

In the first aspect, an embodiment of the present application provides a packaging structure. The packaging structure includes multiple packaging units, and the packaging units include a hard plate region, a winding region, and a fan-out region;

in the packaging structure, the hard plate regions of the packaging unit are stacked, some or all of the fan-out regions are packaged with a chip, and some or all of the fan-out regions packaged with a chip are stacked with the hard plate region after being bent by the winding region.

In one possible implementation mode, the packaging unit includes a flexible dielectric layer and a first wiring layer arranged on one side of the flexible substrate, the flexible dielectric layer being a flexible plate made of a flexible material.

In one possible implementation mode, the packaging unit includes a flexible copper clad laminate, wherein the flexible copper clad laminate includes a flexible dielectric layer and a copper foil layer arranged on one side of the flexible dielectric layer, the flexible dielectric layer is a flexible plate made of a flexible material, and the first wiring layer is located on the copper foil layer.

In one possible implementation mode, the packaging unit packages a single chip or multiple vertically stacked chips in a hard plate region.

In one possible implementation mode, the packaging unit packages a single chip or multiple vertically stacked chips in a fan-out region.

In one possible implementation mode, at least two of the fan-out regions extend in different directions relative to the hard plate region in the packaging structure.

In one possible implementation mode, the packaging structure is provided with a copper pillar extending in the stacking direction at the hard plate region, and the second wiring layer communicating with the copper pillars is provided at two sides of the hard plate region.

In one possible implementation mode, the outer side of the second wiring layer is provided with a solder resist layer and a surface treatment layer.

In one possible implementation mode, the flexible dielectric layer is provided with a reinforcing sheet on one side away from the first wiring layer in the winding region and the fan-out region.

In one possible implementation mode, the first wiring layer is provided with a cover film for insulating on one side away from the flexible dielectric layer in the winding region and the fan-out region.

In a second aspect, an embodiment of the present application provides a manufacturing method for a packaging structure, including the steps of:

A) providing multiple flexible substrates, wherein the flexible substrate includes a hard plate region, a winding region, and a fan-out region;

B) forming a first wiring layer on one side of the flexible substrate;

C) laminating and bonding multiple flexible substrates in a hard plate region to form a multi-layer stack structure;

D) in a hard plate region of the multi-layer stack structure, manufacturing a copper pillar for interlayer connection;

E) manufacturing a second wiring layer connected to the copper pillar on two sides of the hard plate region of the multi-layer stack structure;

F) removing a dielectric material of the multi-layer stack structure on two sides of the winding region and the fan-out region; and G) packaging a chip, and after some or all of the fan-out regions are bent through the winding region, staking the fan-out regions with the hard plate region.

In one possible implementation mode, step A and step B include:

providing multiple flexible copper clad laminates, wherein the flexible copper clad laminate includes a flexible dielectric layer and copper foil layers located on two sides of the flexible dielectric layer;

one face where the first wiring layer is to be manufactured is attached with a photosensitive etching-resistant film, and the other side does not need to be attached with a film;

performing single-face exposure on a flexible substrate attached with a photosensitive etching-resistant film;

exposing a copper foil layer to be etched by developing;

and etching copper foil layers exposed on two sides of the flexible dielectric layer to form a first wiring layer.

In one possible implementation mode, step B further includes:

laminating a cover film for insulation on a whole face of one side of the first wiring layer away from the flexible dielectric layer;

and retaining the cover film in the winding regions and the fan-out regions by means of pattern transfer.

In one possible implementation mode, step C includes:

pre-attaching a bonding sheet on a wiring surface required to be bonded according to a stacking sequence;

pre-attaching a high-temperature resistant strippable adhesive in the winding region and the fan-out region;

laminating an insulating dielectric layer on a non-adhesive face of a flexible substrate; and laminating and bonding a multi-layer flexible substrate to form a multi-layer stack structure.

In one possible implementation mode, step D includes:

in the hard plate region of a multi-layer stack structure, performing mechanical drilling to form a via hole for inter-layer conduction;

manufacturing a seed layer on a surface of the multi-layer stack structure;

attaching a photosensitive plating resist dry film, and exposing a hole requiring hole-filling electroplating by means of pattern transfer;

performing hole-filling electroplating;

attaching a photosensitive plating resist dry film and exposing a position where a copper pillar is required through pattern transfer;

and electroplating to manufacture the copper pillar.

In one possible implementation mode, step E includes:

manufacturing a second wiring layer by means of pattern transfer;

and manufacturing a solder resist layer and a surface treatment layer on the outer side of the second wiring layer.

BRIEF DESCRIPTION OF THE DRAWINGS

In order to explain the embodiments of the present application or the technical solution in the related art more clearly, the following will briefly introduce the drawings that need to be used in the description of the embodiments or the elated art. Obviously, the drawings in the following description are merely one or more embodiments of the present application. For those of ordinary skills in the art, other drawings can be obtained based on these drawings without creative efforts.

DETAILED DESCRIPTION OF THE INVENTION

In order to make the objects, technical solutions, and advantages of the embodiments of the application clearer, the technical solutions of the embodiments of the application will be clearly and completely described with reference to the drawings in the embodiments of the application, and obviously, the described embodiments are part of the embodiments of the application, not all embodiments. Based on the embodiments of the present application, all other embodiments obtained by a person of ordinary skills in the art without involving any inventive effort are within the scope of the present application.

Figure 1A:
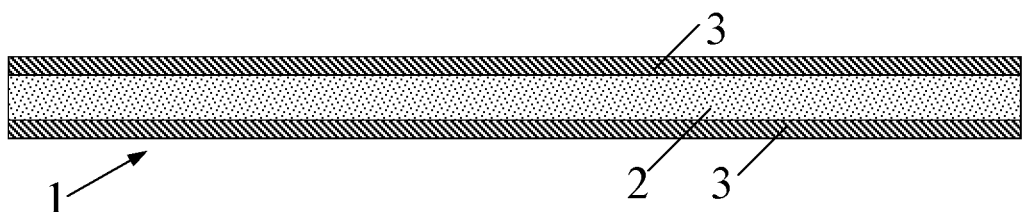
FIGS. 1A to 1R are schematic views of a packaging structure provided by an embodiment of the present application during a manufacturing process.
Figure 1B:
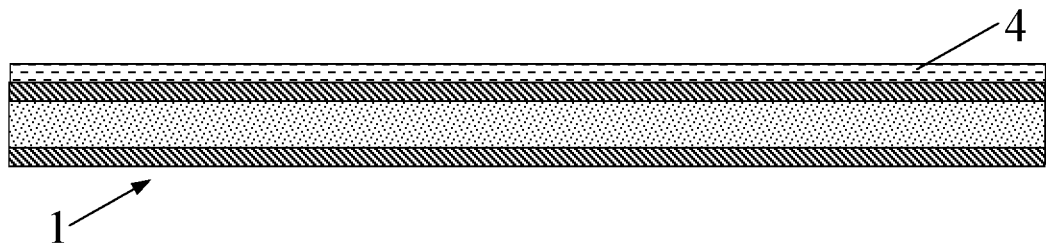
Figure 1C:
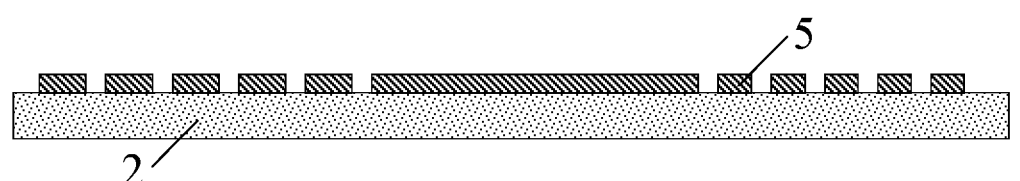
Figure 1D:
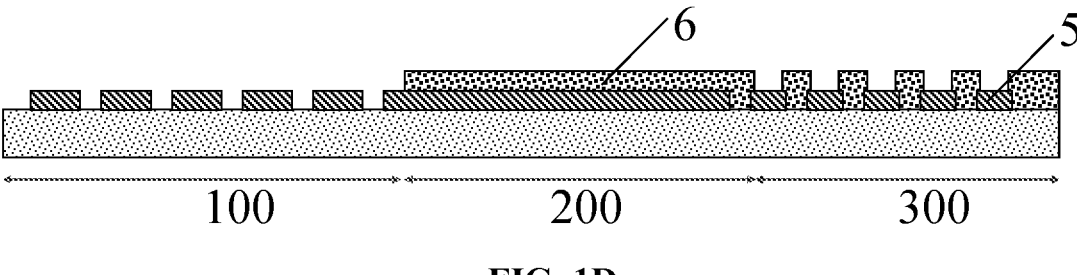
Figure 1E:
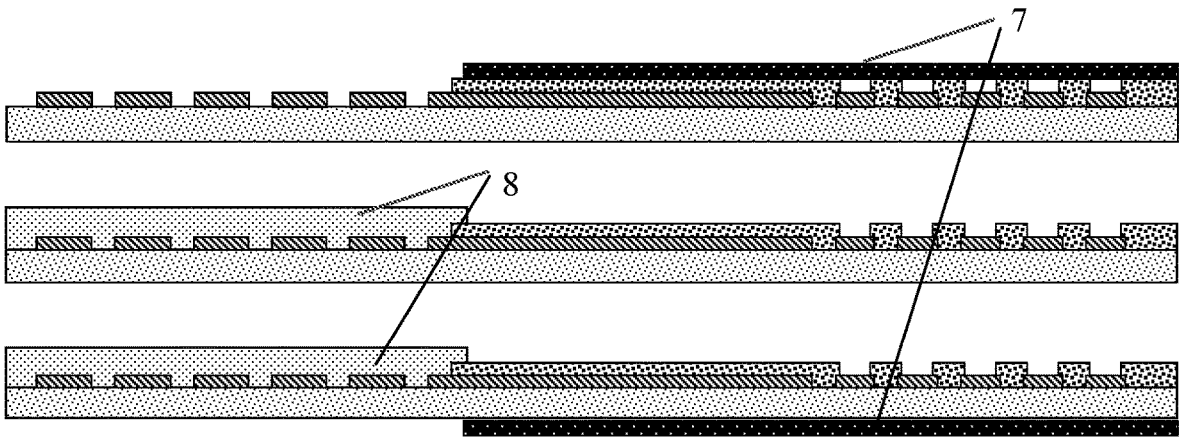
Figure 1F:
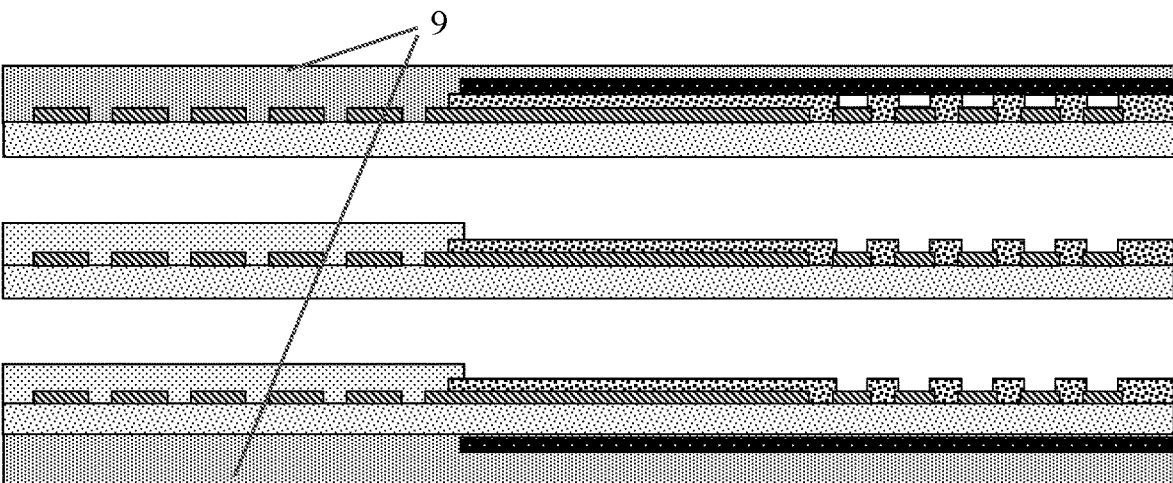
Figure 1G:
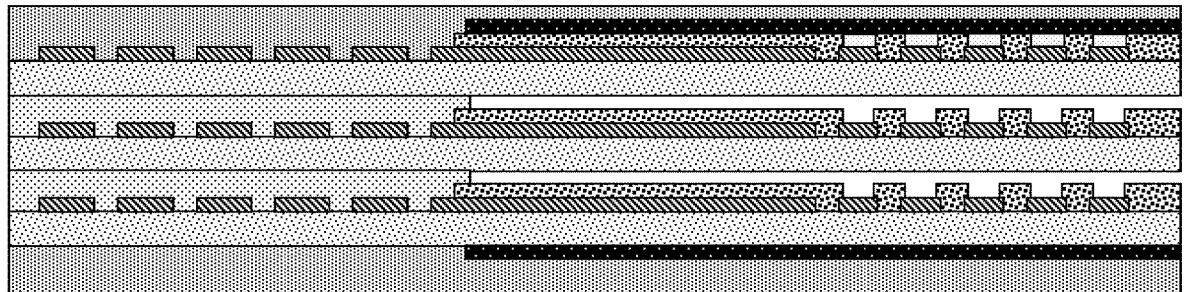
Figure 1H:
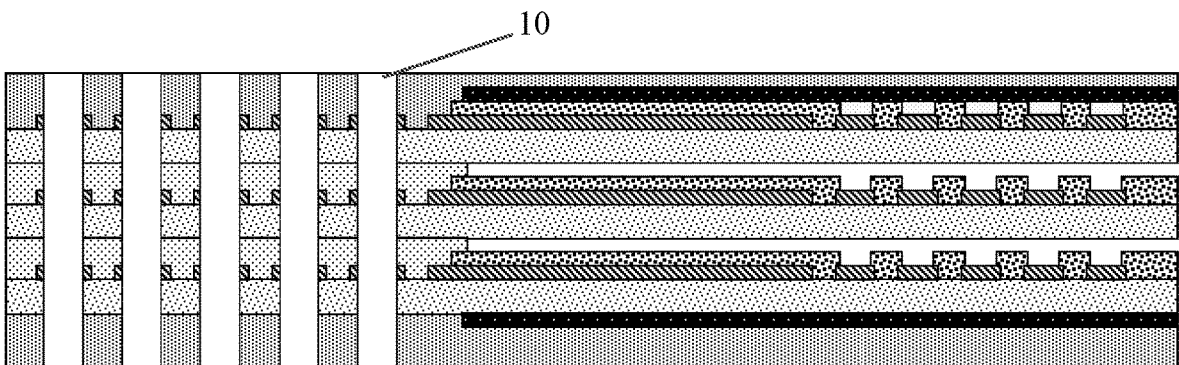
Figure 1I:
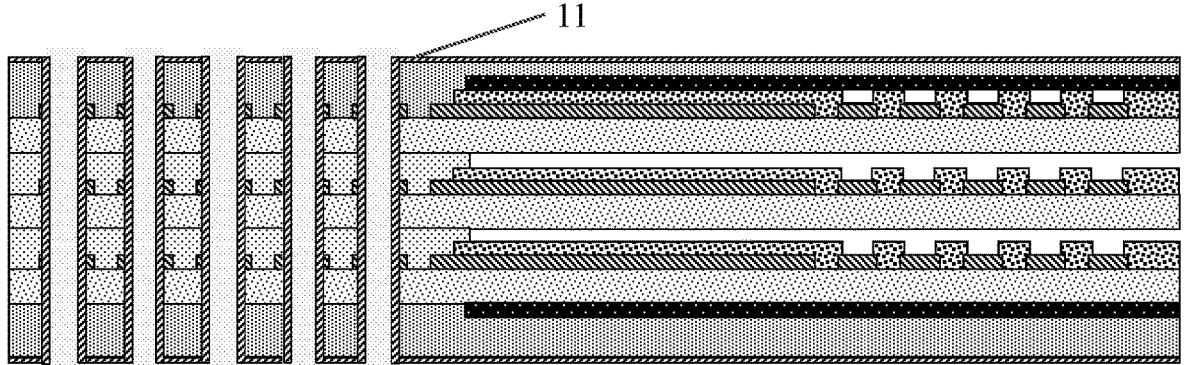
Figure 1J:
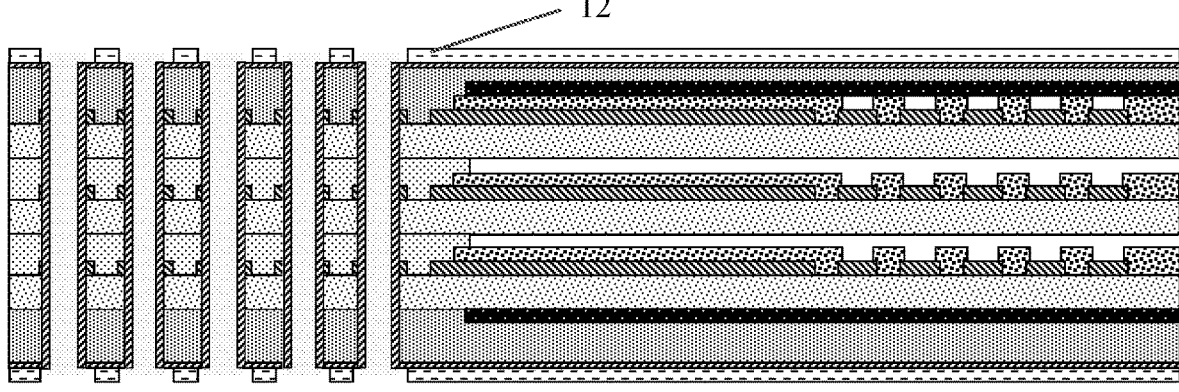
Figure 1N:
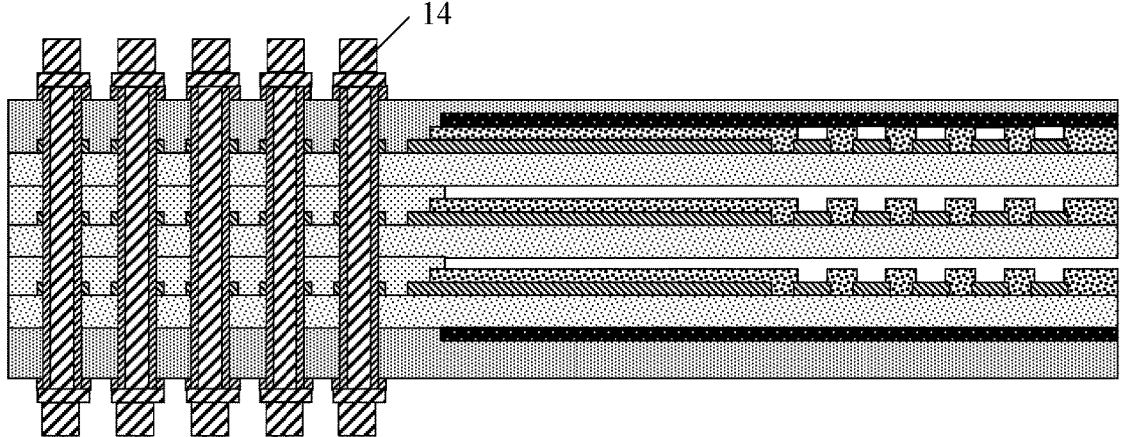
Figure 1O:
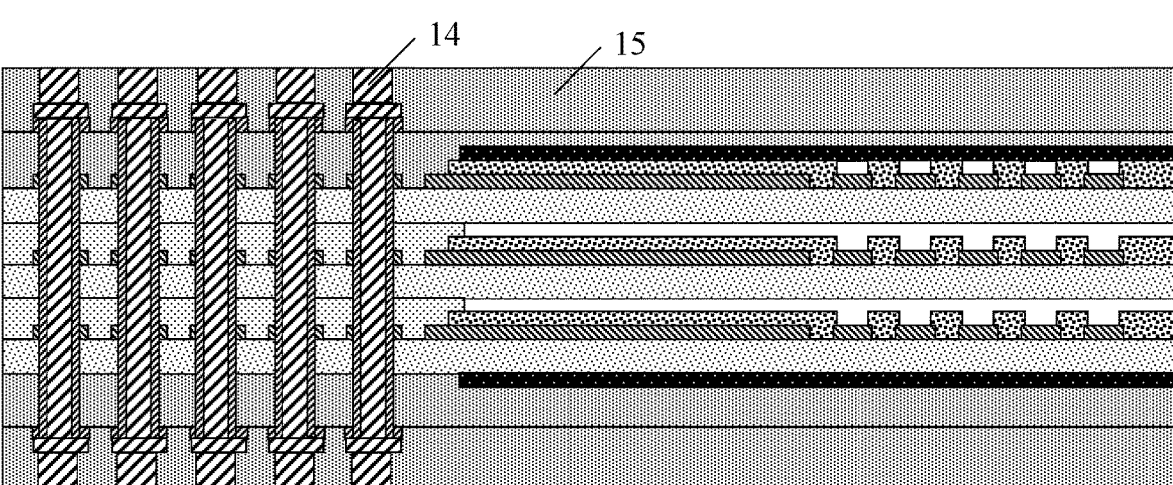
Figures 1P, 1Q:
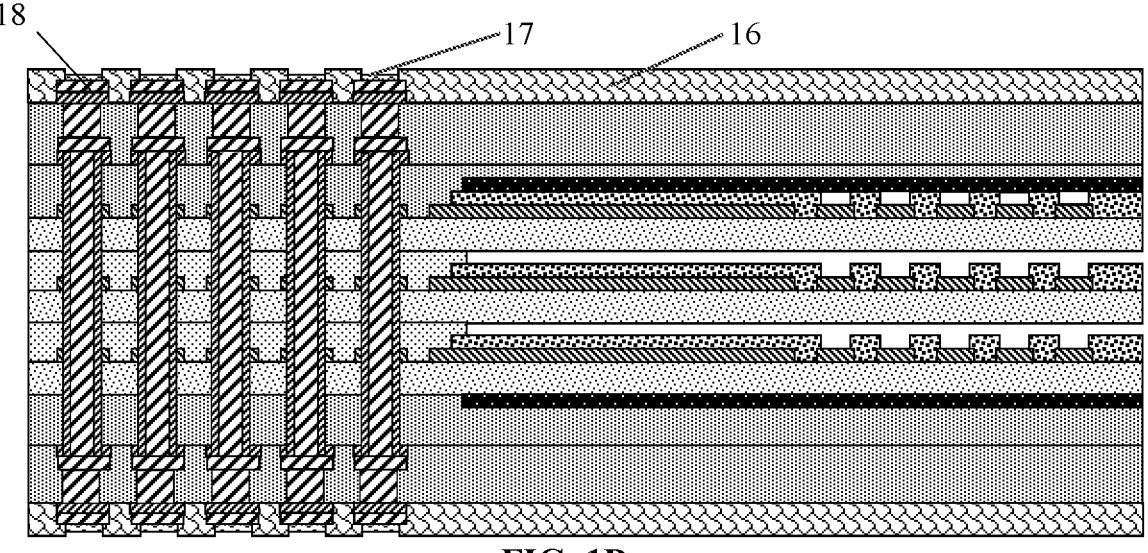
Figure 1R:
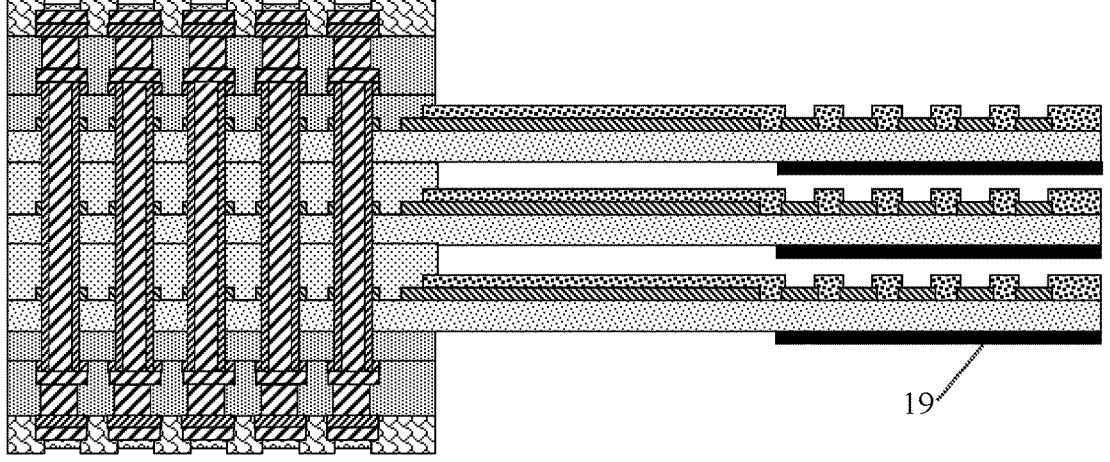

FIGS. 1A to 1R are schematic views of a packaging structure provided by an embodiment of the present application during a manufacturing process. As shown in FIGS. 1A-1R, the manufacturing method for a packaging structure includes the following steps.

As shown in FIG. 1A, there is provides multiple flexible substrates (step A);

The flexible substrate has a plate-like structure made of a flexible material, and can be bent flexibly, that is, can be bent under the action of an external force, and after bending, does not return to a state before bending without the action of an external force. According to different design requirements, the flexible substrate is divided into a hard plate region, a winding region, and a fan-out region.

In some embodiments, the flexible substrate can be a flexible copper clad laminate (FCCL) on which copper foil can be bonded on one or both sides of the flexible dielectric layer. Preferably, the flexible copper clad laminate 1 in the present embodiment is a structure having copper foils on both sides, namely, the flexible copper clad laminate includes a flexible dielectric layer 2 and copper foil layers 3 on two side faces of the flexible dielectric layer 2.

Then, as shown in FIG. 1C, forming a first wiring layer on one side of the flexible substrate (step B);

The first wiring layer is typically formed by pattern transfer. For example, in a possible implementation mode, step B includes applying a seed layer on the flexible substrate, applying a metal layer on the seed layer, applying a photoresist layer on the metal layer, patterning the photoresist layer to form a pattern exposing the metal layer, and etching the metal layer and the seed layer under the pattern to form a wiring layer.

It can be seen from the above-mentioned description that in the present embodiment, the flexible substrate is a flexible copper clad laminate 1 with two faces having a copper foil layer. Therefore, step B includes forming a first wiring layer 5 on one face of the flexible copper clad laminate 1, and completely etching the copper on the other face to expose the flexible dielectric layer 2. The specific method includes:

As shown in FIGS. 1B and 1C, only one face where the first wiring layer is to be manufactured is attached with the photosensitive etching-resistant dry film 4, and the other face is not attached with a film; then, one face of the flexible substrate to which the photosensitive etching-resistant dry film 4 is attached is exposed, and the other face is not exposed; the copper to be etched is exposed by developing, and the exposed copper is completely etched by means of acid etching; a structure in which the first wiring layer is formed on one face and the flexible dielectric layer is directly exposed on the other face is formed after the film is removed, as shown in FIG. 1C.

In a possible implementation mode, step B further includes:

as shown in FIG. 1D, laminating a cover film 6 on the first wiring layer 5 of the flexible substrate;

wherein the flexible substrate includes a hard plate region 100, a winding region 200, and a fan-out region. The cover film 6 acts as line insulation and is retained only in the winding region 200 and the fan-out region 300. The specific method includes:

laminating one layer of a photosensitive cover film 6 on the whole face of the winding region 200 and the fan-out region 300, and selectively retaining the cover film 6 in the winding region 200 and the fan-out region 300 by means of exposure and development such that the other parts can be completely developed and eliminated; it also being possible to use a non-photosensitive cover film 6, and remove parts of the cover film 6 not needing to be retained by means of laser cutting or mechanical milling before laminating.

Then, laminating and bonding multiple flexible substrates in a hard plate region to form a multi-layer stack structure (step C).

In one embodiment, as shown in FIGS. 1E to 1G, step C includes:

pre-attaching a bonding sheet 8 on the wiring surface required to be bonded according to the up and down sequence relationship of the stack, the main function of the bonding sheet 8 being bonding multiple flexible substrates together to form a multi-layer stack structure. The bonding sheet 8 can be manufactured in advance by means of a mechanical gong or laser cutting. The parts which do not need to be bonded are cut and removed, and the parts which need to play the function of bonding are retained;

A high-temperature resistant strippable adhesive 7 is pre-attached in the winding region and fan-out region, and the purpose of providing the high-temperature resistant strippable adhesive 7 is to isolate the dielectric layers on two sides, and the dielectric layers on two sides can be separated by stripping the high-temperature resistant strippable adhesive 7;

according to the laminated plate sequence relationship of a multi-layer flexible substrate, the first insulating dielectric layer 9 is laminated on the non-bonding face of a flexible substrate, and the first insulating dielectric layer 9 may adopt the prepreg (PP) or ABF (Ajinomoto build-up film substrate) materials.

The multi-layer flexible substrate is then laminated and bonded to form a multi-layer stack structure as shown in FIG. 1G.

Then, as shown in FIG. 1O, in a hard plate region of a multi-layer stack structure, manufacture a copper pillar for interlayer connection (step D);

As shown in FIGS. 1H to 1O, in a possible implementation mode, the method includes:

performing, in a hard plate region of a multi-layer stack structure, mechanical drilling or laser drilling an "X"-shaped hole to form a via hole 10 for inter-layer conduction; and after completing the via hole 10, manufacturing one layer of thin metal on the surface of the multi-layer stack structure as a conductive seed layer 11 for subsequent electroplating.

The manufacturing method for the seed layer 11 includes:

performing de-smearing treatment on the multi-layer stack structure after the via hole 10;

performing Sputter processing on the whole plate of the multi-layer stack structure after the de-smearing treatment, and sputtering about 1 μm of metal Ti and 0.8-4 μm thick metal Cu; and performing PTH on the multi-layer flexible plate after Sputter processing, and depositing metal Cu at about 0.6-1 μm.

After completing the manufacture of the seed layer 11, attaching a first photosensitive plating resist dry film 12 to the whole plate, and exposing a hole that needs to be electroplated to fill by means of pattern transfer; then, filling the hole by hole-filling electroplating; after hole-filling electroplating, attaching a second photosensitive plating resist dry film 13 on the existing basis, and then exposing a position where a copper pillar needs to be made through exposure and development; and performing plasma cleaning of the previously developed flexible substrate and then performing copper pillar electroplating to form an interlayer connected copper pillar layer 14.

Then, the first photosensitive plating-resistant dry film 12 and the second photosensitive plating resist dry film 13 are removed, and the seed layer is etched on the whole plate. The seed layer can include titanium, copper, titanium copper, or titanium tungsten alloy, etc. and the seed layer can be manufactured by means of depositions, electroless plating, or sputtering.

Then, the second insulating dielectric layer 15 is laminated. After the second insulating dielectric layer 15 is thermally cured, a part of the second insulating dielectric layer 15 is thinned by means of a grinding plate or plasma etching so as to expose the copper pillar layer 14 to facilitate the inter-layer conduction in the subsequent manufacturing.

Then, as shown in FIG. 1P, manufacturing a second wiring layer connected to the copper pillar on two sides of the hard plate region of the multi-layer stack structure (step E);

The second wiring layer 18 can be realized by means of pattern transfer, for example, in an implementation mode, including manufacturing a seed layer-filming-exposing-developing-electroplating-film removing-etching the seed layer.

Step E may also include manufacturing a solder resist layer 16 and a surface treatment layer 17. The manufacturing method for the solder resist layer 16 is roller coating or screen printing; the surface treatment mode is electroplating Ni—Au, Ni—Pd—Au, or OSP (Organic Solderability Preservatives).

Then, as shown in FIG. 1Q, remove the dielectric material of the multi-layer stack structure on two sides of the winding region and the fan-out region (step F).

In step F, by means of a mechanical depth-control gong, the gong is to the position of high temperature resistant adhesive in the inner layer, and the dielectric layer required to be removed is torn off together with the high temperature resistant adhesive.

As shown in FIG. 1R, in a possible implementation mode, it is also possible to alternatively attach a reinforcing sheet 19 to the fan-out region as desired on one side of the flexible dielectric layer which is away from the first wiring layer in order to increase the rigidity.

Then, the chip is packaged. After some or all of the fan-out regions are bent via the winding region, the fan-out regions are stacked with the hard plate region (step G); please refer to FIGS. 2 to 5.

An embodiment of the present application provides a packaging structure manufactured by the above-mentioned manufacturing method. The packaging structure includes multiple packaging units, and the packaging units include a hard plate region, a winding region, and a fan-out region;

In the packaging structure, the hard plate regions of the packaging unit are stacked. Some or all of the fan-out regions are packaged with a chip, and some or all of the fan-out regions packaged with a chip are bent by the winding region and then stacked with the hard plate region.

Alternatively, the packaging unit includes a flexible dielectric layer and a first wiring layer arranged on one side of the flexible substrate, the flexible dielectric layer being a flexible plate made of a flexible material.

Alternatively, the packaging unit includes a flexible copper clad laminate, wherein the flexible copper clad laminate includes a flexible dielectric layer and a copper foil layer arranged on one side of the flexible dielectric layer, the flexible dielectric layer is a flexible plate made of a flexible material, and the first wiring layer is located on the copper foil layer.

Alternatively, the packaging unit packages a single chip or multiple vertically stacked chips in a hard plate region.

Alternatively, the packaging unit packages a single chip or multiple vertically stacked chips in a fan-out region.

Alternatively, at least two of the fan-out regions extend in different directions relative to the hard plate region in the packaging structure.

Alternatively, the packaging structure is provided with a copper pillar extending in the stacking direction at the hard plate region, and the second wiring layer communicating with the copper pillars is provided at two sides of the hard plate region.

Alternatively, the outer side of the second wiring layer is provided with a solder resist layer and a surface treatment layer.

Alternatively, the flexible dielectric layer is provided with a reinforcing sheet on one side away from the first wiring layer in the winding region and the fan-out region.

Alternatively, the first wiring layer is provided with a cover film for insulating on one side away from the flexible dielectric layer in the winding region and the fan-out region.

Figure 2:
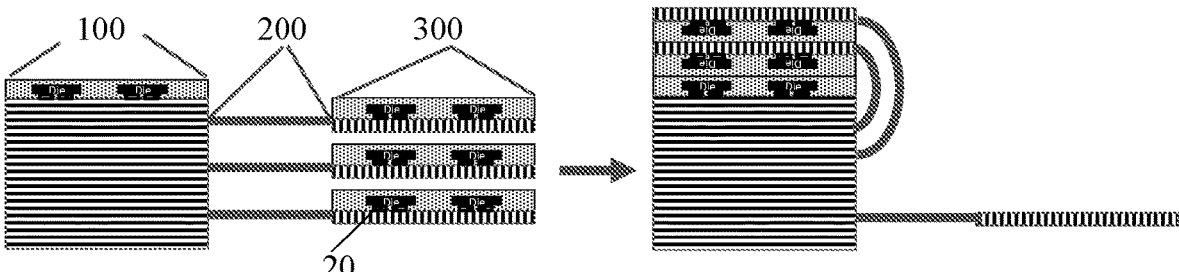
FIG. 2 is a schematic structural view of a packaging structure provided by an embodiment of the present application.

FIG. 2 is a schematic structural view of a packaging structure provided by an embodiment of the present application. As shown in FIG. 2, in the packaging structure, a part of a fan-out region 300 packages a chip (Die) 20 and then stacks with a hard plate region 100 by turning over by a winding region 200, retaining a part of the fan-out region 300 which does not need to be packaged.

Figure 3:
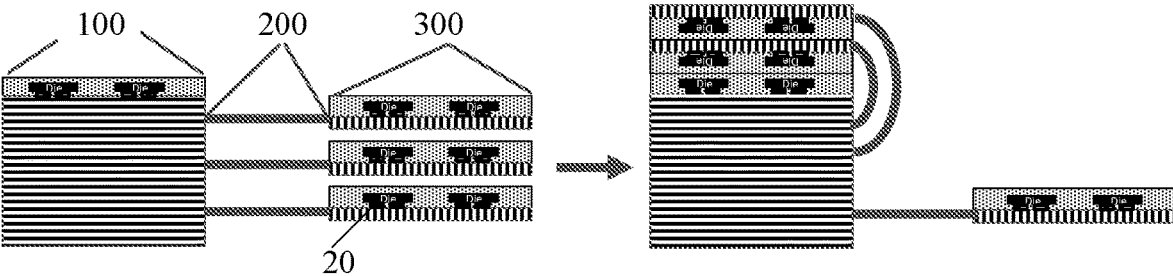
FIG. 3 is a schematic structural view of another packaging structure provided by an embodiment of the present application.

FIG. 3 is a schematic structural view of another packaging structure provided by an embodiment of the present application. As shown in FIG. 3, in the packaging structure, all of the fan-out regions 300 package a chip 20 and then selectively stack with a hard plate region 100 by turning over by a winding region 200.

Figures 4, 5:
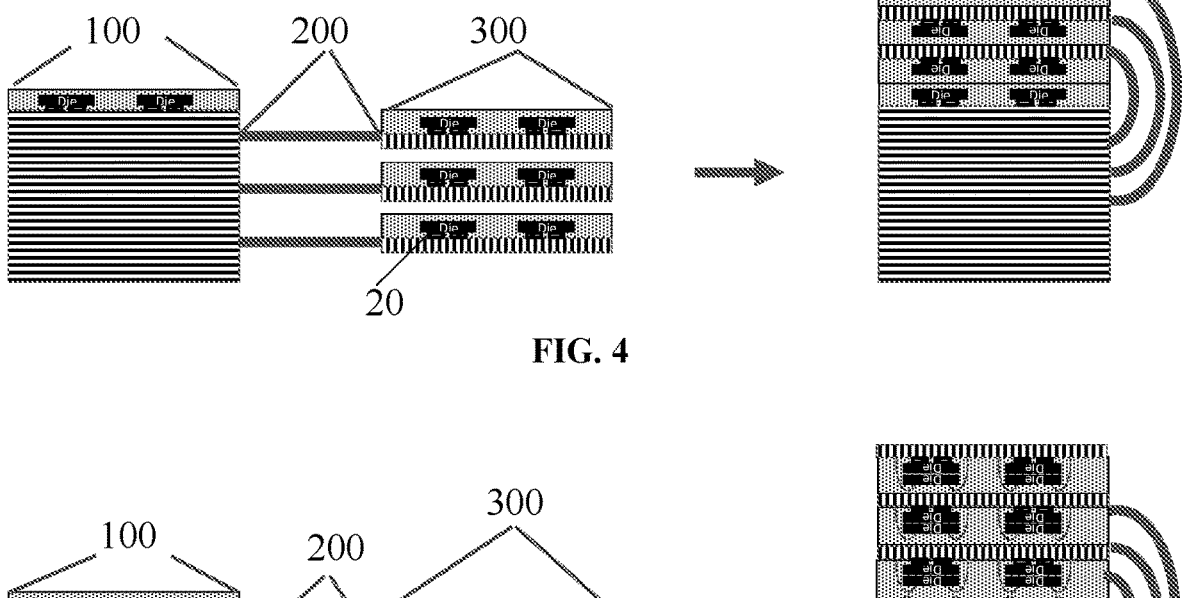
FIG. 4 is a schematic structural view of another packaging structure provided by an embodiment of the present application.
FIG. 5 is a schematic structural view of another packaging structure provided by an embodiment of the present application.

FIG. 4 is a schematic structural view of another packaging structure provided by an embodiment of the present application. As shown in FIG. 4, in the packaging structure, all of the fan-out regions 300 package a chip 20 and then stack with a hard plate region 100 by turning over by a winding region 200. A single chip 20 is packaged in both the hard plate region 100 and the fan-out region 300.

FIG. 5 is a schematic structural view of another packaging structure provided by an embodiment of the present application. As shown in FIG. 5, in the packaging structure, all of the fan-out regions 300 package a chip 20 and then stack with a hard plate region 100 by turning over by a winding region 200. Two chips 20 are stacked and packaged in both the hard plate region 100 and the fan-out region 300.

However, the packaging structure provided by the embodiments of the present application is not limited thereto. For example, multiple stacked chips can be packaged at a packaging position, and fan-out packaging can also be implemented on two sides, three sides, or four sides of the hard plate region.

In the packaging mechanism and manufacturing method provided in the embodiments of the present application, multiple X, Y plane fan-out interconnected packaging modules are manufactured on a flexible material by using the property of the flexible material, and each module is separately packaged and then packaged by stacking. Besides, the interconnections between a chip and a chip, and between a chip and a substrate are achieved through wiring in a flexible substrate without interference between packages of each other.

Compared with the conventional PoP package, the impact of warpage on electrical interconnection is avoided; compared with the conventional MCP package, the size of a packaged chip is not limited, and there is no reliability risk caused by the suspended stacking of chips. At the same time, the partial fan-out region can be vertically stacked with the hard plate region, and at the same time, the partial fan-out region can be retained according to specific requirements such that the packaging form can be more flexible and changeable.

In addition, according to the characteristics of flexible materials, multiple modules can be bent freely in multiple angles, multiple directions and with multiple functions, so as to realize more chip package integration and meanwhile, reduce the occupied area of X and Y.

In the description of embodiments of the present application, it needs to be noted that the terms "center", "up", "down", "left", "right", "vertical", "horizontal", "inner", "outer", etc. indicate the orientation or positional relationship based on the orientation or positional relationship shown in the drawings, and are only for the convenience of describing the present application and simplifying the description, rather than indicating or implying that the device or element must have a specific orientation or be constructed and operated in a specific orientation, and therefore cannot be understood as the limitation of the present application. Further, the terms "first", "second", and "third" are used for descriptive purposes only, and are not to be construed as indicating or implying relative importance.

In the description of the embodiments of the present application, it needs to be noted that, unless otherwise clearly specified and defined, the terms "installed", "linked", and "connected" should be interpreted broadly, for example, a fixed connection, or a detachable connection, or an integral connection; a mechanical connection or an electrical connection; a direct connection or an indirect connection through an intermediate medium, and an interconnection between two elements. For those of ordinary skills in the art, the specific meaning of the above-mentioned terms in the embodiments of the present application can be understood according to specific circumstances.

Further, the technical features involved in different implementation modes of the application described above may be combined with each other as long as they do not conflict with each other.

So far, the technical solution of the present application has been described with reference to the preferred implementation modes shown in conjunction with the accompanying drawings, but it is readily understood by those skilled in the art that the scope of protection of the present application is obviously not limited to these specific implementation modes. Without departing from the principles of the present application, those skilled in the art can make equivalent changes or substitutions to the relevant technical features, and the technical solutions after these changes or substitutions will fall within the protection scope of the present application.

What is claimed is:

1. A packaging structure comprises:

multiple packaging units comprising a hard plate region with at least four layers, a winding region with at least two layers, and a fan-out region with at least two layers, wherein the fan-out region has the same layers as the winding region and each layer of the fan-out region is connected with a layer of the hard plate region by a layer of winding region;

wherein the at least four layers of the hard plate regions of the packaging unit are stacked, some or all of the fan-out regions are packaged with a chip, and the some or all of the fan-out regions packaged with a chip are stacked with the hard plate region after being bent by the winding region;

wherein the packaging unit comprises a first wiring layer on each corresponding layer of the hard plate region and the winding region and the fan-out region, and the first wiring layer electrically connects the chip in the fan-out region with the hard plate region;

wherein the packaging unit comprises copper pillars extending in a stacking direction throughout the hard plate region, and each second wiring layer is provided at each side of the hard plate region to electrically connect with each other via the copper pillar and the second wiring layers communicate with the chip in the fan-out region via the first wiring layer and the copper pillar;

wherein each layer of the winding region or each layer of the fan-out region is detachable from each other, and at least two layers of the fan-out region detach from each other and wind in different directions relative to the hard plate region in the packaging structure.

2. The packaging structure according to claim 1, wherein the packaging unit includes a flexible dielectric layer and a first wiring layer provided at one side of the flexible dielectric layer, the flexible dielectric layer being a flexible plate made of a flexible material.

3. The packaging structure according to claim 1, wherein the packaging unit comprises a flexible copper clad laminate, the flexible copper clad laminate comprising a flexible dielectric layer and a copper foil layer provided on one side of the flexible dielectric layer, the flexible dielectric layer being a flexible plate made of a flexible material, and the first wiring layer being located on the copper foil layer.

4. The packaging structure according to claim 1, wherein the packaging unit packages a single chip or multiple vertically stacked chips in the hard board region.

5. The packaging structure according to claim 4, wherein the packaging unit packages a single chip or multiple vertically stacked chips in the fan-out region.

6. The packaging structure according to claim 1, wherein an outer side of a second wiring layer is provided with a solder resist layer and a surface treatment layer.

7. The packaging structure according to claim 2, wherein, in the winding region and the fan-out region, the flexible dielectric layer is provided with a reinforcing sheet on one side away from the first wiring layer.

8. The packaging structure according to claim 2, wherein the first wiring layer is provided with a cover film for insulation on one side away from the flexible dielectric layer in the winding region and the fan-out region.

9. The packaging structure according to claim 1, where in at least one layer of the fan-out region is not stacked on the hard plate region.

\* \* \* \* \*